United States Patent
Riley

(10) Patent No.: US 10,109,994 B2
(45) Date of Patent: Oct. 23, 2018

(54) MULTIPLE CURRENT SENSOR SYSTEM

(71) Applicant: LITTELFUSE, INC., Chicago, IL (US)

(72) Inventor: James Riley, Everson, WA (US)

(73) Assignee: Littelfuse, Inc., Chicago, IL (US)

( * ) Notice: Subject to any disclaimer, the term of this patent is extended or adjusted under 35 U.S.C. 154(b) by 391 days.

(21) Appl. No.: 15/079,531

(22) Filed: Mar. 24, 2016

(65) Prior Publication Data

US 2017/0279261 A1    Sep. 28, 2017

(51) Int. Cl.
| | |
|---|---|
| *H02H 3/08* | (2006.01) |
| *H02H 3/087* | (2006.01) |
| *H02H 3/093* | (2006.01) |
| *G01R 19/165* | (2006.01) |
| *B60R 16/03* | (2006.01) |

(52) U.S. Cl.
CPC .............. *H02H 3/08* (2013.01); *B60R 16/03* (2013.01); *G01R 19/16566* (2013.01)

(58) Field of Classification Search
CPC ........... H02H 3/08; H02H 3/087; H02H 3/093
USPC .......................................... 361/86, 93.1–93.7
See application file for complete search history.

(56) References Cited

U.S. PATENT DOCUMENTS

| | | | | |
|---|---|---|---|---|
| 5,495,381 A | * | 2/1996 | Mrowiec ................ | H02H 3/38 361/20 |
| 2012/0022813 A1 | * | 1/2012 | Van Riet ............... | G01R 22/10 702/62 |
| 2012/0044600 A1 | * | 2/2012 | Roscoe ................ | H02H 1/0015 361/18 |
| 2015/0375634 A1 | * | 12/2015 | Kim ................ | G01R 19/16542 307/131 |

OTHER PUBLICATIONS

ISR and Written Opinion dated Jun. 5, 2017 in corresponding PCT/US2017/021798.

* cited by examiner

*Primary Examiner* — Dharti Patel

(57) ABSTRACT

Provided herein are improved current monitoring systems for monitoring currents having large ranges. A current monitor can include two or more current sensors. At least two of the current sensors can have different current measurement ranges and different current measurement sensitivities. Each current sensor can be associated with one or more current monitoring thresholds. A time delay or time threshold can correspond to each current monitoring threshold. Each current sensor can monitor a same current having a large range of possible current values. When a predetermined current threshold is exceeded for an amount of time exceeding a corresponding time threshold, a signal can be generated by the current sensor. The generated signal can indicate that the measured current exceeds the predetermined current threshold for the corresponding predetermined period of time.

19 Claims, 7 Drawing Sheets

MULTIPLE CURRENT SENSOR SYSTEM

FIELD OF THE DISCLOSURE

This disclosure relates generally to the field of sensor systems, more particularly, to current monitoring using multiple current sensors.

BACKGROUND OF THE DISCLOSURE

In many conventional current monitoring systems, one or more currents having large ranges are often monitored. To handle the large current ranges, high current sensors are often used. However, these high current sensors are generally not sensitive enough to accurately measure lower value currents. When more sensitive current sensors are used instead, the risk of the high sensitivity current sensors entering saturation for high current situations increases. Overall, accurately measuring currents having large ranges is often deficient for many conventional current monitoring systems.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

Accordingly, there is a need for a current monitoring system having improved accuracy and reliability over larger current ranges.

Various embodiments are generally directed to a current monitor having two or more current sensors. At least two of the current sensors can have different current measurement ranges and different current measurement sensitivities. Each sensor can be associated with one or more current monitoring thresholds. A time delay or time threshold can correspond to each current monitoring threshold. Each sensor can monitor a same current having a large range of possible current values. When a predetermined current threshold is exceeded for an amount of time exceeding a corresponding time threshold, a signal can be generated by the current sensor. The generated signal can indicate that the measured current exceeds the predetermined current threshold for the corresponding predetermined period of time.

BRIEF DESCRIPTION OF THE DRAWINGS

By way of example, specific embodiments of the disclosed device will now be described, with reference to the accompanying drawings, in which.

DETAILED DESCRIPTION

Figure 1:
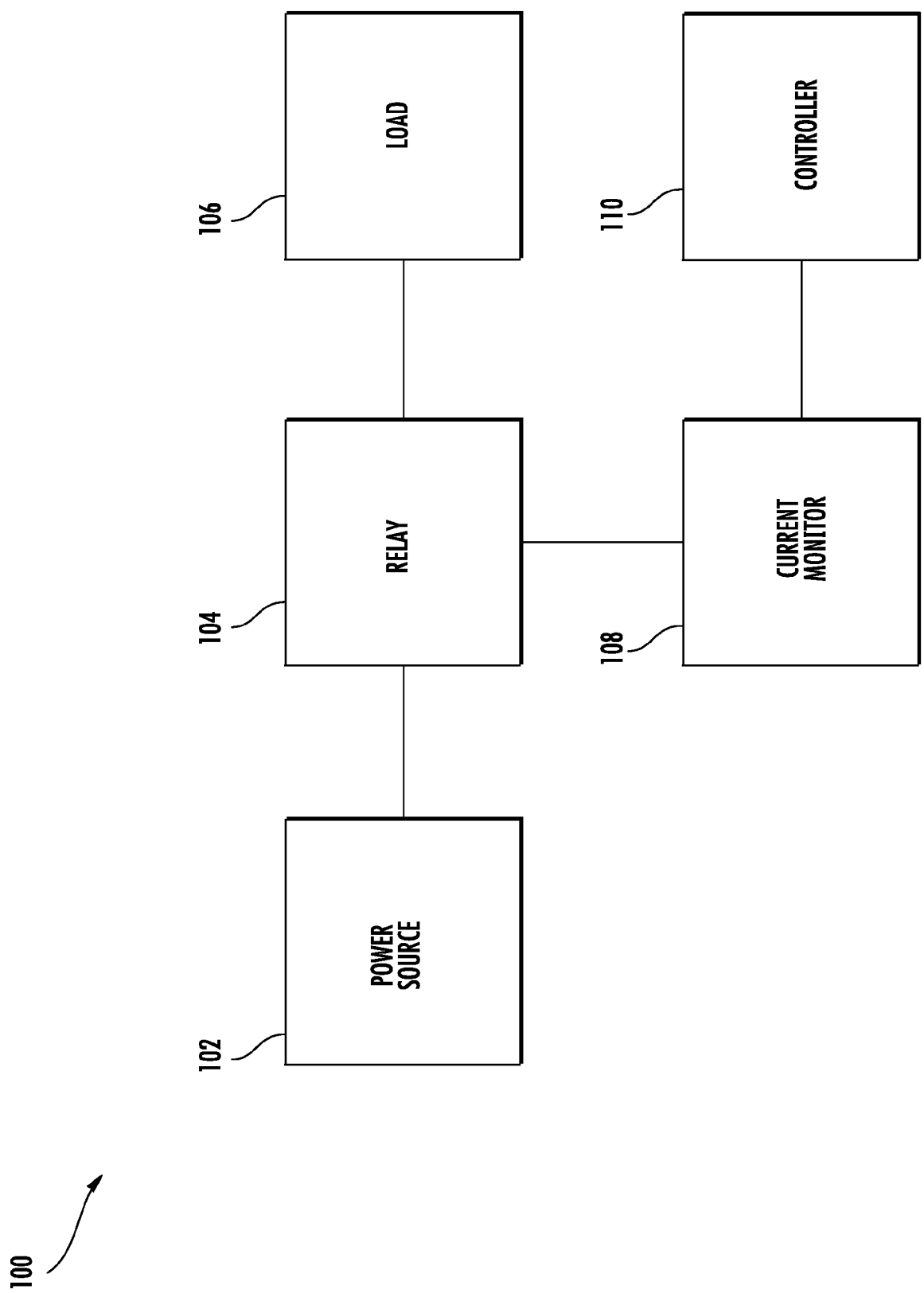
FIG. 1 illustrates an exemplary power distribution and control system.

The present disclosure will now be described more fully hereinafter with reference to the accompanying drawings, in which preferred embodiments are shown. This disclosure, however, may be embodied in many different forms and should not be construed as limited to the embodiments set forth herein. Rather, these embodiments are provided so that this disclosure will be thorough and complete, and will fully convey the scope of the disclosure to those skilled in the art. In the drawings, like numbers refer to like elements throughout.

FIG. 1 illustrates an exemplary power distribution and control system 100. The power distribution and control system 100 can include a power source 102, a relay 104, a load 106, a current monitor 108, and a controller 110.

The power source 102 can be, for example, a battery. In various embodiments, the power source 102 can be an automobile battery. The load 106 can represent electronic circuits and/or devices downstream from the power source 102. These electronic components, as represented by the load 106, can receive power from the power source 102 during normal operation of the power distribution and control system 100.

The load 106 can be coupled to the power source 102 by the relay 104. As shown in FIG. 1, the relay 104 is coupled to the power source 102 and the load 106 is coupled to the relay 104. The relay 104 can be an electromagnetic relay and/or an electrically operated switch. The relay 104 can operate as a protection relay and/or switch. As an example, the relay 104 can operate to prevent or limit damage to the load 106 upon the occurrence of a fault condition. Fault conditions can include, for example, overvoltage or overcurrent conditions relative to the load 106.

During normal operation, when a fault condition is not detected or occurring, the relay 104 can provide power from the power source 102 to the load 106. When a fault condition is detected or occurs, the relay 104 can decouple the load 106 from the power source 102. During such situations, the relay 104 can disrupt electrical connectivity between the load 106 and the power source 102. As such, the relay 104 can ensure power is provided to the load 106 when an overvoltage or overcurrent condition is not detected or occurring (e.g., when the relay 104 is in a closed positioned) and can isolate and protect the load 106 when an overvoltage or overcurrent condition is detected or occurring (e.g., when the relay 104 is in an open position).

The current monitor 108 can be coupled to the relay 104. The current monitor 108 can monitor and/or measure a current in the relay 104. The current monitor 108 can include two or more current sensors. The two or more current sensors of the current monitor 108 can be positioned or arranged to monitor and/or measure approximately the same current that flows from the power source 102, through the relay 104, and to the load 106 (e.g., a supply current provided by the power source 102 when the relay 104 provides connectivity between the power source 102 and the load 106).

The two or more current sensors of the current monitor 108 can have different current measurement ranges and current measurement sensitivities. A current measurement range for a current sensor can be the range of currents over which the current sensor can accurately detect, measure, or monitor currents. A current measurement sensitivity for a current sensor can be a level of accuracy or measurement gradation of the current sensor. As an example, one of the current sensors of the current monitor 108 can have a current measurement range of −300 Amps (A) to 300 A and a current measurement sensitivity of 1 A. As such, in this example, the current sensor of the current monitor 108 can measure a current in the relay having a value anywhere between −300 A and 300 A within an accuracy of 1 A (e.g., in 1 A intervals).

The two or more sensors in the current monitor 108 can determine when the current in the relay 104 exceeds one or more thresholds. Upon detection of the current in the relay 104 exceeding a predetermined threshold, the current monitor 108 can generate a signal indicating the threshold has been exceeded. The generated signal can be provided to the controller 110. The controller 110 can control and monitor operation of the power distribution and control system 100. For example, the controller 110 can control operation of the relay 104. Specifically, the controller 110 can control when the relay 104 provides electrical connectivity between the power source 102 and the load 106 and when the relay 104 is to decouple the load 106 from the power source 102.

The controller 110 can control the relay 104 based on the receipt of signals from the current monitor 108. For example, upon receipt of a signal from the current monitor 108 that one or more current thresholds have been exceeded by the current in the relay 104, the controller 110 can determine to open the relay 104 such that the load 106 is decoupled from the power source 102. In this way, protection from overvoltage or overcurrent conditions can be provided to the load 106.

As an alternative or in addition thereto, any signal generated by the current monitor 108 based on current threshold monitoring can directly control the relay 104 (e.g., can cause the relay 104 to open) or can include an alarm signal. An alarm signal generated by the current monitor 108 can directly or indirectly signal an alarm condition (e.g., current threshold exceeded) in an audible and/or visual manner.

In general, the current monitor 108 can generate a communication signal, a control signal, or an alarm signal, or any combination thereof. Any signal generated by the current monitor 108 can be based on detection that the current in the relay 104 exceeds a predetermined current threshold as mentioned previously.

A communication signal generated by the current monitor 108 can be provided to another component of the power distribution and control system 100. The communication signal can include information regarding the current in the relay 104 exceeding a predetermined threshold (e.g., notification of the condition of the current in the relay 104). As an example, the current monitor 108 can generate a communication signal and can provide the communication signal to the controller 110. In various embodiments, the controller 110 can be an engine control unit (ECU) and the current monitor 108 can provide any generated communication signal to the controller 110 over a controller area network (CAN) or local interconnect network (LIN).

A control signal generated by the current monitor 108 can be provided to control or affect operation of any other component of the power distribution and control system 100. As an example, the current monitor can generate a control signal to adjust operation of the relay 104 in response to the current in the relay 104 exceeding a predetermined threshold.

An alarm signal generated by the current monitor 108, as mentioned above, can include any visual or audible signal intended to alert a user of the power distribution and control system 100 of an alarm condition (e.g., that the current of the relay 104 exceeds a predetermined threshold).

In conventional power distribution and control systems, current monitors typically have a single current sensor. In general, the single current sensor is unable to effectively monitor current over a large range of currents. For example, many of the more sensitive current sensors fall into saturation during high current situations while current sensors designed to handle high current situations are not sensitive enough to effectively measure low currents. As a result, many conventional power distribution and control systems fail to effectively monitor and appropriately react to a wide range of current levels.

In contrast, with the current monitor 108 of the power distribution and control system 100, multiple current sensors can be used. For example, the current sensors, as mentioned above, can have different sensitivities which enables monitoring over a larger range of currents with increased sensitivity (e.g., in comparison to using only a single current sensor).

Figure 2:
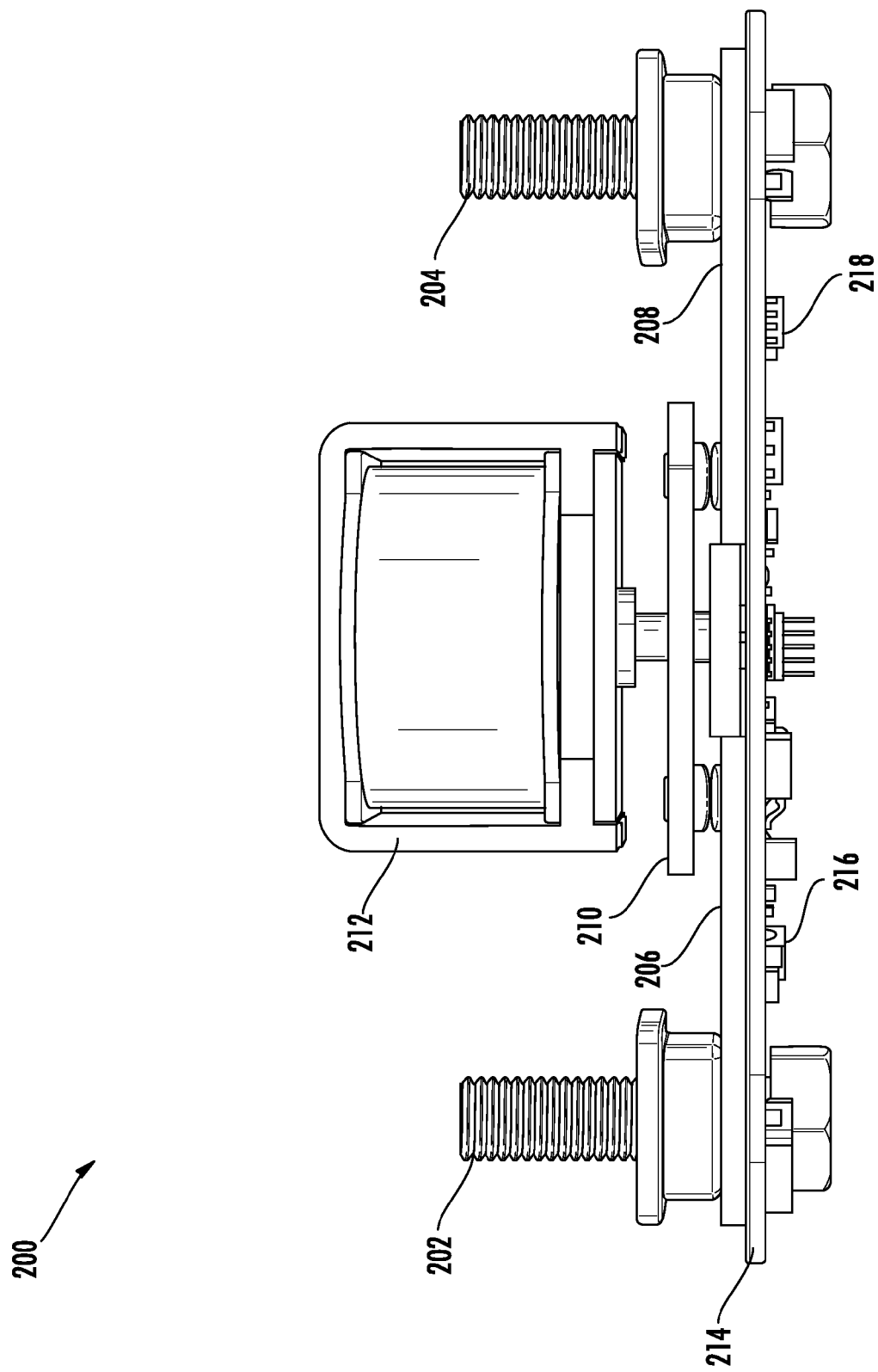
FIG. 2 illustrates an exemplary current monitoring system.

FIG. 2 illustrates an exemplary current monitoring system 200. The current monitoring system 200 can include portions of a relay (e.g., the relay 104) and a current monitor (e.g., the current monitor 108). As shown in FIG. 2, the current monitoring system 200 can include an input connection or stud 202 and an output connection or stud 204. The input stud 202 can be connected to a first portion or component of a power supply (e.g., the power source 102). The output stud 204 can be connected to a first portion or component of a load (e.g., the load 106).

As further shown in FIG. 2, the current monitoring system 200 can include a first stationary conductor or bus bar 206 and a second stationary conductor or bus bar 208. The bus bar 206 can be coupled to the input stud 202 and the bus bar 208 can be coupled to the output stud 204. A moveable bus bar or conductor 210 can be coupled between the bus bar 206 and the bus bar 208.

The moveable bus bar or contact 210 can determine electrical connectivity between the bus bar 206 and the bus bar 208. During normal operation of the current monitoring system 200, a current (e.g., the current of the relay 104) can flow from the input stud 202, through the bus bar 206, through the moveable conductor 210, through the bus bar 208, and to the output stud 204. When an overvoltage or overcurrent condition is detected or occurs, the moveable conductor 210 can be disconnected from the bus bar 206 and the bus bar 208, thereby disrupting the flow of current from the input stud 202 to the output stud 204. As an example, the moveable conductor 210 can move in a vertical direction (relative to the orientation of the current monitoring system 200 as depicted in FIG. 2) so as to become disconnected from the bus bar 206 and the bus bar 208.

The current monitoring system 200 can further include a solenoid or coil 212. Additionally, the current monitoring system 200 can include a printed circuit board (PCB) 214 upon which constituent components of the current monitoring system 200 can be mounted. The input stud 202, the output stud 204, the bus bar 206, the bus bar 208, the moveable conductor 210, and the solenoid can form a portion of a relay (e.g., the relay 104). In various embodiments, these components can form a portion of a main disconnect coupled to a power source such as, for example, a battery (e.g., an automobile battery).

As shown in FIG. 2, the current monitoring system 200 can include a first current sensor 216 and a second current sensor 218. The first current sensor 216 and the second current sensor 218 can be magnetic current sensors. In various embodiments, the first current sensor 216 and the second current sensor 218 can be Hall sensors.

The first current sensor 216 and the second current sensor 218 can be arranged or positioned to measure approximately the same current that flows between the input stud 202 and the output stud 204 (e.g., the relay or power source current). Specifically, the first current sensor 216 can be arranged to detect and/or measure current that flows through the bus bar 206 and the second current sensor 218 can be arranged to detect and/or measure current that flows through the bus bar 208. As shown in FIG. 2, the first current sensor 216 and the second current sensor 218 can be positioned on a same side of the PCB 214 opposite a side containing the bus bars 206 and 208. The first current sensor 216 and the second current sensor 218 can be positioned approximately the same distance away from the bus bar 206 and the bus bar 208, respectively, such that the first current sensor 216 and the second current sensor 218 approximately measure the same current that flows through the bus bar 206 and the bus bar 208.

The first current sensor 216 and the second current sensor 218 can be part of a current monitor (e.g., the current monitor 108). As such, the current monitoring system 200 can represent all or a portion of the relay 104 and the current monitor 108 as depicted in FIG. 1 but is not so limited. That is, the relay/circuit protection components and functions of the current monitoring system 200 and the current detection components and functions of the current monitoring system 200 can be separated and not combined and arranged on the same PCB as depicted in FIG. 2.

The first current sensor 216 and the second current sensor 218 can each have a current measurement range and a current measurement sensitivity. The current measurement ranges and sensitivities of the first current sensor 216 and the second current sensor 218 can be different. For example, the current measurement range and current sensitivity for the first sensor 216 can be larger than the current measurement range and current sensitivity for the second sensor 216. In an embodiment, the first current sensor 216 can have a current measurement range of −300 A to 300 A and a current sensitivity of 1 A while the second current sensor 218 can have a current measurement range of −100 A to 100 A and a current sensitivity of 0.25 A. Accordingly, the first current sensor 216 and the second current sensor 218 can effectively measure the same current that passes through the bus bars 206 and 208 at different sensitivity levels.

The first current sensor 216 and the second current sensor 218 can each be programmed to include one or more predetermined current thresholds for monitoring. The predetermined thresholds can each be within the respective current measurement ranges of the first and second current sensors 216 and 218. For example, the first current sensor 216 can be configured or programmed according to a first current threshold within its current measurement range and the second current sensor 218 can be configured or programmed according to a second current threshold within its current measurement range. The thresholds for each of the first and second sensors 216 and 218 can be different. The thresholds for each of the first and second sensors 216 and 218 can each be considered to be current set points for the current sensors 216 and 218.

Further, the first and second current sensors 216 and 218 can be programmed or designed to determine an amount of time a current being measured exceeds a particular current threshold. The amount or period of time associated with a particular current threshold can be considered to be a time delay or trigger delay. For example, the first current sensor 216 can monitor a predetermined current threshold of 250 A with an associated time delay of 15 seconds. Accordingly, the first current sensor 216 can determine how long a current it is detecting or measuring approximately equals or exceeds 250 A. Once the detected current approximately equals or exceeds 250 A for at least 15 seconds, the first current sensor 216 can perform a function in response thereto. As an example, the first current sensor 216 can generate a signal indicative of the detected current exceeding a current set point or threshold for a predetermined amount of time.

Similarly, as an example, the second sensor 218 can monitor a threshold of 75 A with an associated time delay of 1 minute. Accordingly, the second current sensor 218 can determine how long a current it is detecting or measuring approximately equals or exceeds 75 A. Once the detected current approximately equals or exceeds 75 A for at least 1 minute, the second current sensor 218 can perform a function in response thereto. As an example, the second current sensor 218 can generate a signal indicative of the detected current exceeding a current set point or threshold for a predetermined amount of time.

In the above described example, the first time delay (15 seconds) corresponding to the first threshold of the first current sensor 216 is smaller than the second time delay (1 minute) corresponding to the second threshold of the second current sensor 218; however, such time delays are not so limited. In general, the time delays associated with thresholds of the less sensitive sensor (e.g., high current sensor) may be shorter than the time delays associated with the thresholds of the more sensitive sensor (e.g., low current sensor).

By having the first and second current sensors 216 and 218 associated with different current thresholds and corresponding time delays, the first and second current sensors 216 and 218 can more effectively monitor the conditions of a current over a larger range of currents, for a wider range of performance conditions of the current, and with improved sensitivity, particularly given the different current measurement ranges and sensitivities of the first and second current sensors 216 and 218.

Again, the one or more current thresholds or current set points of the first and second current sensors 216 and 218 can be predetermined. Further, the time delays or amounts of time (e.g., time thresholds) associated with each current threshold can also be predetermined. In various embodiments, the time delay can be approximately set to 0 seconds such that, for example, the first current sensor 216 immediately reacts to a current exceeding the corresponding threshold (i.e., there is no time delay).

The first and second current sensors 216 and 218 can continuously monitor and measure the current in the bus bars 206 and 208, respectively. The measured values of this current can be continuously reported by the first and second current sensors 216 and 218 (e.g., to the controller 110) and/or stored to a memory. Further, the first and second current sensors 216 and 218 can report when a predetermined is threshold is exceeded. Additionally, as discussed above, the first and second current sensors 216 and 218 can also report when a predetermined threshold is exceeded for a corresponding predetermined period of time.

The first and second current sensors 216 and 218 can, as discussed above, generate a signal in response to a predetermined threshold being exceeded for a predetermined period of time. The signal can be a communication signal, control signal, or an alarm signal, or any combination thereof as discussed above in relation to FIG. 1. In general, the current monitoring system 200 can employ any number of sensors and the sensors can be associated with any number of current set points and corresponding time delay triggers.

Figure 3:
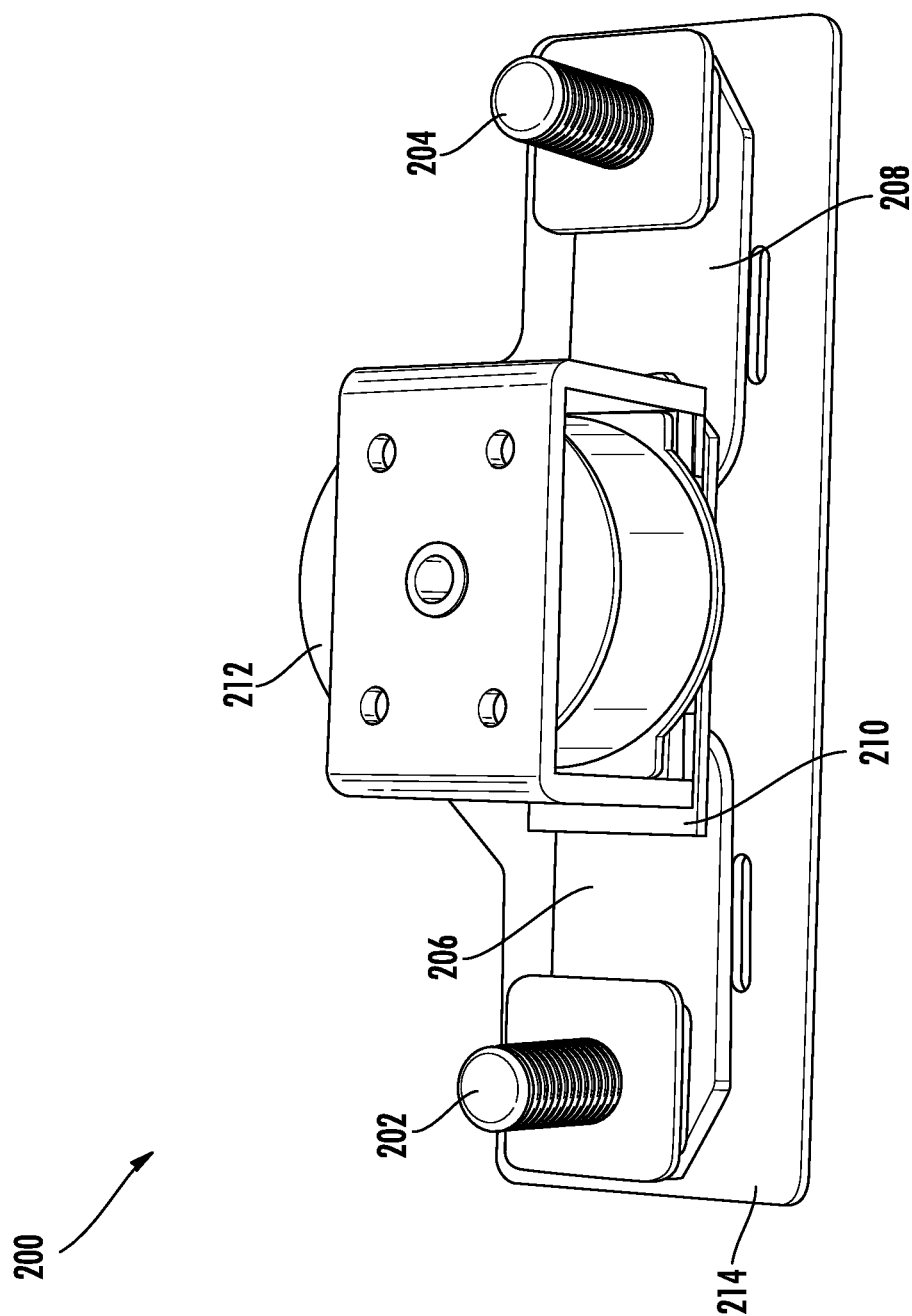
FIG. 3 illustrates a first perspective view of the current monitoring system depicted in FIG. 2.
Figure 4:
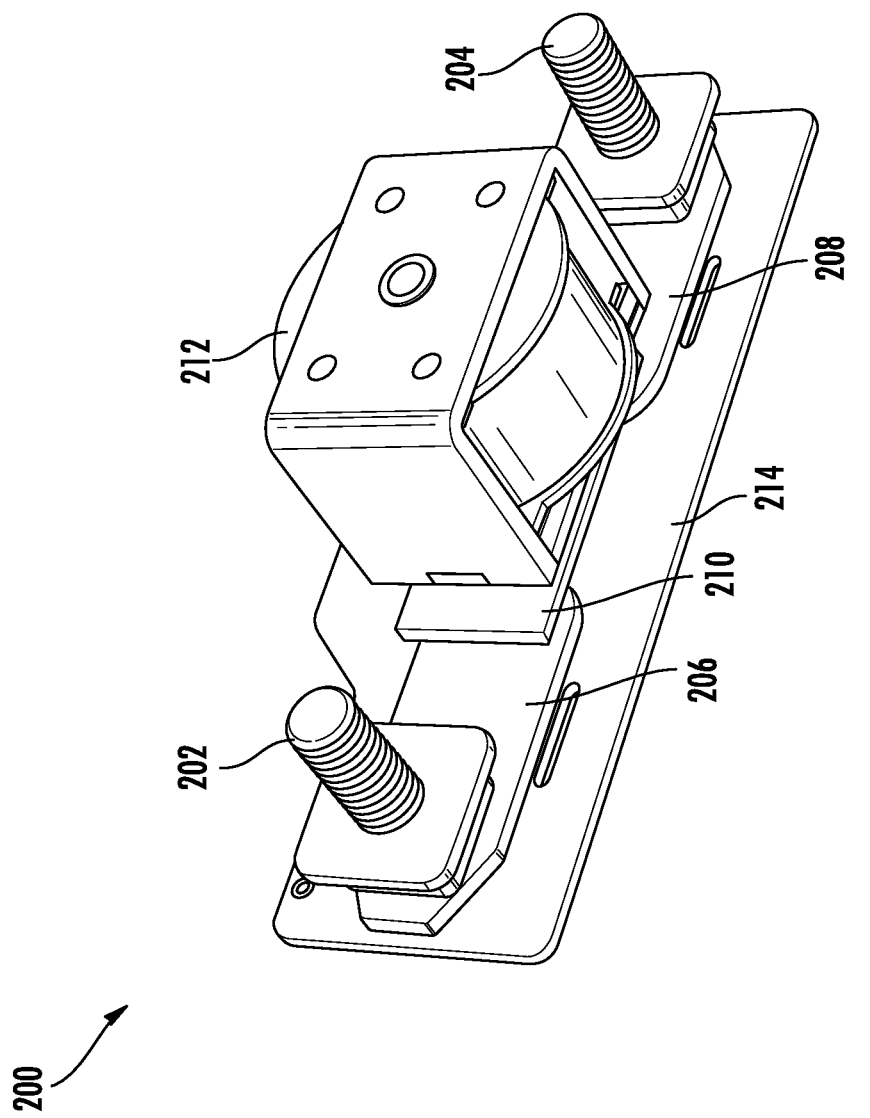
FIG. 4 illustrates a second perspective view of the current monitoring system depicted in FIG. 2.

FIGS. 3-6 illustrate the current monitoring system 200 in a variety of views. For example, FIG. 3 illustrates a first perspective view of the exemplary current monitoring system 200 and FIG. 4 illustrates a second perspective view of the exemplary current monitoring system 200. FIGS. 3 and 4 are provided to illustrate an exemplary arrangement of the input stud 202, the output stud 204, the bus bar 206, the bus bar 208, the moveable conductor 210, the solenoid or coil 212, and the PCB 214.

Figure 5:
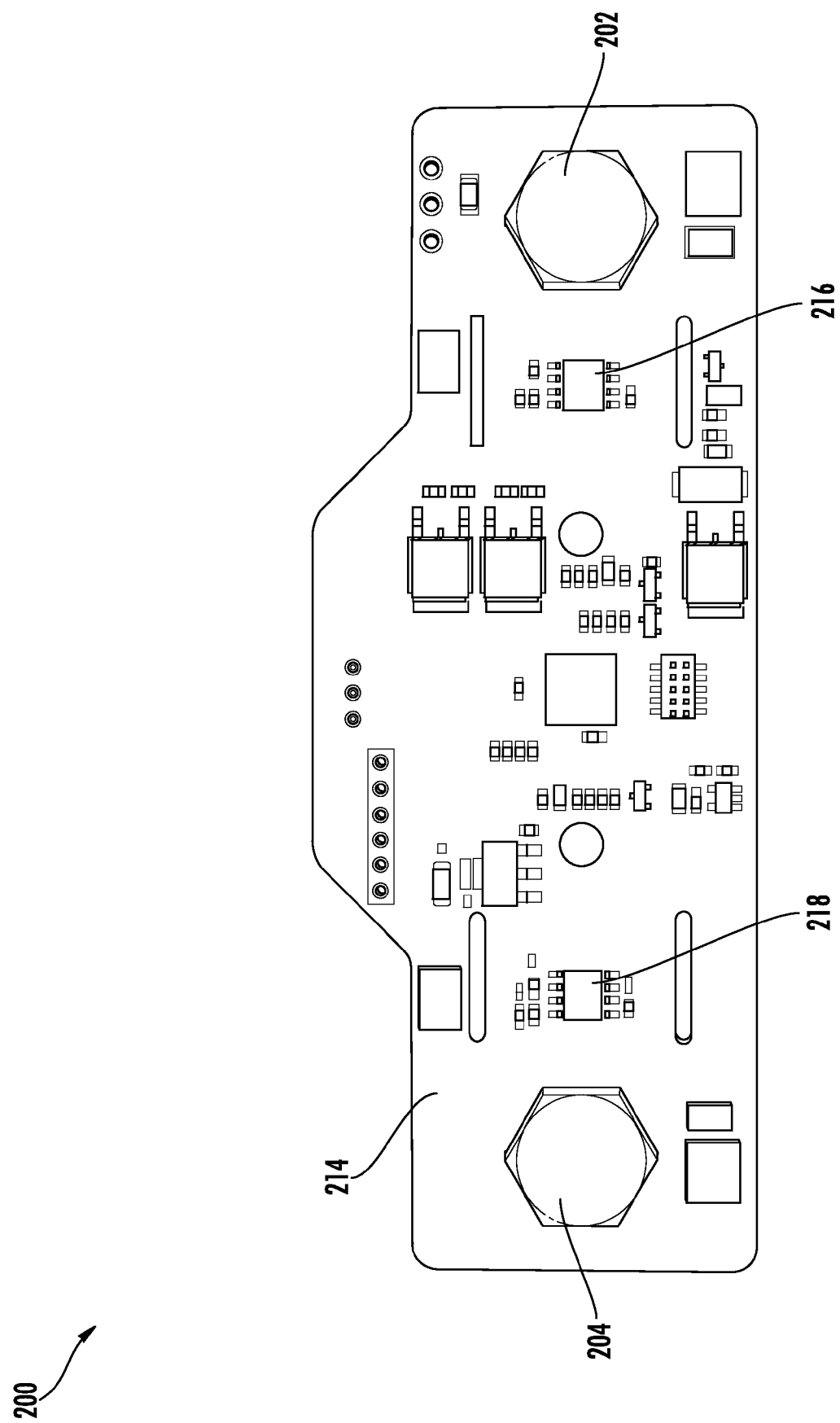
FIG. 5 illustrates a bottom view of the current monitoring system depicted in FIG. 2.

FIG. 5 illustrates a bottom view of the current monitoring system 200. As shown in FIG. 5, the first current sensor 216 and the second current sensor 218 can be attached or mounted to a bottom of the PCB 214. The first current sensor 216 and the second current sensor 218 can be positioned underneath areas where the bus bars 206 and 208 (not shown in FIG. 5) are located. In doing so, since the bus bars 206 and 208 carry or conduct approximately the same current, the first current sensor 216 and the second current sensor 218 can approximately detect and/or measure the same current.

Figure 6:
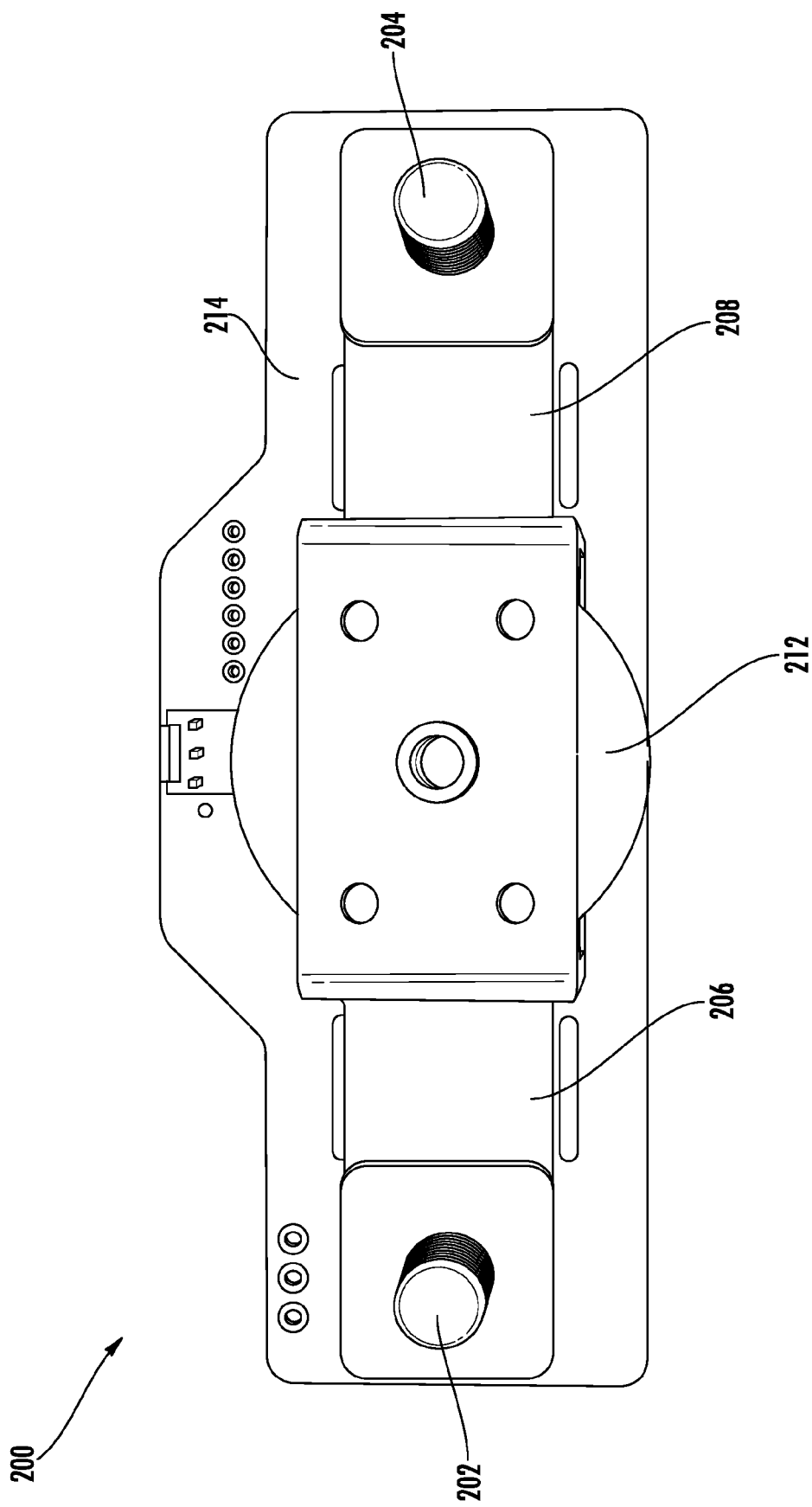
FIG. 6 illustrates a top view of the current monitoring system depicted in FIG. 2.

FIG. 6 illustrates a top view of the current monitoring system 200. As shown, FIG. 6 illustrates exemplary arrangements of the solenoid 212, the bus bar 206, the bus bar 208, the input stud 202, and the output stud 204 on the PCB 214.

Figure 7:
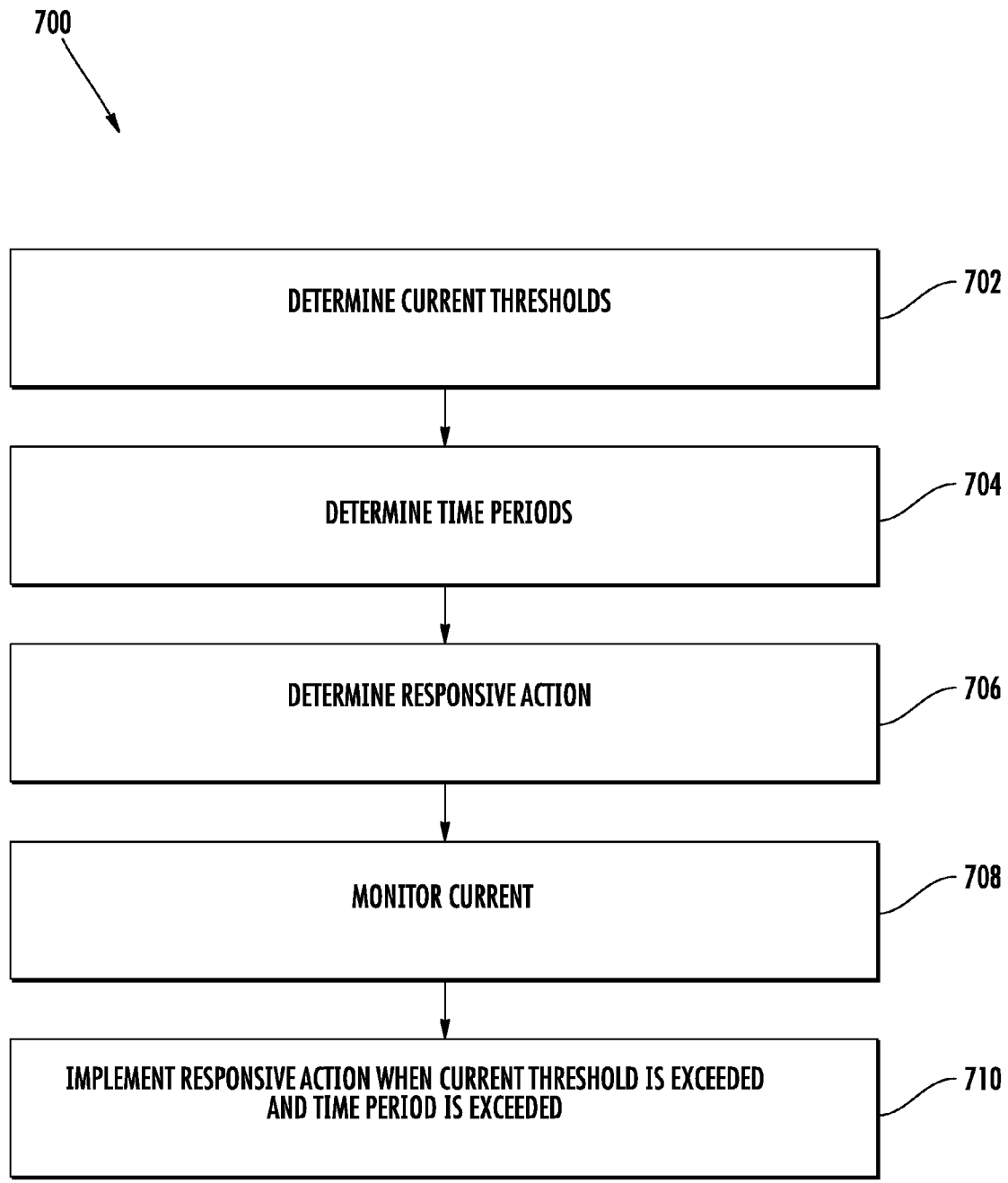
FIG. 7 illustrates an exemplary flow diagram for a method for monitoring current using two or more current sensors.

FIG. 7 illustrates an exemplary flow diagram for a method for monitoring current using two or more current sensors 700. The method illustrated in FIG. 7 can be implemented using the power distribution and control system 100 and/or the current monitoring system 200.

At step 702, current thresholds or set points for two or more current sensors can be determined or set. Each current sensor can have a current measurement range and a current measurement sensitivity. The current measurement range and current measurement sensitivity of at least two of the current sensors can be different. One or more current thresholds can be set for each current sensor.

At step 704, a time period or time delay (or time threshold) corresponding to each current threshold for each current sensor can be determined or set.

At step 706, a responsive action for each current threshold-time period pairing can be determined or set for each current sensor. The responsive action can specify an action to occur when a predetermined current threshold is approximately exceeded for a period of time that approximately exceeds the corresponding predetermined time period for the predetermined current threshold. Responsive actions can include generating a signal indicating that the predetermined current threshold has been exceeded for the predetermined time period. The generated signal can be an alarm signal, a communication signal, or a control signal, or any combination thereof, as discussed above.

At step 708, the two or more current sensors monitor a current. Monitoring the current can include continuously or periodically measuring the current and can further include continuously or periodically storing current measurements or reporting current measurements. The two or more current sensors can monitor a same current. For example, the two or more current sensors can be positioned or arranged so as to approximately measure the same current flowing through one or more conductors. In doing so, at least current sensors, having different current measurement ranges and sensitivities, can measure values of the same current.

At step 710, a predetermined responsive action is implemented. The predetermined responsive action—which can be set in step 706—can be implemented when a predetermined current threshold of a current sensor is approximately exceeded for an amount of time corresponding to a predetermined time threshold.

In general, the current monitoring systems and methods described herein can provide improved current monitoring by using two or more current sensors having different current ranges and sensitivities such that more effective monitoring over a large current range can be achieved. By establishing different current set points and time thresholds for the two or more current sensors, current threshold monitoring and responses thereto can be provided. The techniques described herein can be applied to electro-mechanical fuses, state of charge monitoring systems, high current monitoring systems, and any other systems benefiting from monitoring of current over large ranges.

While the present disclosures references certain embodiments, numerous modifications, alterations and changes to the described embodiments are possible without departing from the sphere and scope of the present disclosure, as defined in the appended claim(s). Accordingly, it is intended that the present disclosure not be limited to the described embodiments, but that it has the full scope defined by the language of the following claims, and equivalents thereof.

The invention claimed is:

1. An apparatus, comprising:
a power source;
a relay coupled to the power source;
a load coupled to the relay, wherein the relay couples the load to the power source when the relay is in a closed position;
a current monitor coupled to the relay; and
a controller coupled to the current monitor, wherein the current monitor includes a first current sensor and a second current sensor, wherein the first and second current sensors each measure a current of the relay, wherein the first current sensor determines when the current of the relay exceeds a first current set point within a first current measurement range for a first period of time and the second current sensor determines when the current of the relay exceeds a second current set point within a second current measurement range for a second period of time.

2. The apparatus of claim 1, the first current sensor having a first current measurement sensitivity and the second current sensor having a second current measurement sensitivity.

3. The apparatus of claim 2, wherein the first current measurement range is larger than the second current measurement range.

4. The apparatus of claim 3, wherein the first current measurement sensitivity is larger than the second current measurement sensitivity.

5. The apparatus of claim 4, wherein the first period of time is less than the second period of time.

6. The apparatus of claim 1, wherein the power source is a battery.

7. The apparatus of claim 1, wherein the controller is an engine control unit (ECU).

8. The apparatus of claim 1, wherein the first current sensor generates a first signal when the current of the relay exceeds the first current set point for the first period of time.

9. The apparatus of claim 8, wherein the first signal is provided to the controller.

10. The apparatus of claim 9, wherein the controller causes the relay to open to decouple the load from the power source based on receipt of the first signal.

11. The apparatus of claim 8, wherein the first signal causes the relay to open to decouple the load from the power source.

12. The apparatus of claim 8, wherein the first signal includes an alarm signal indicating that the current of the relay exceeds the first current set point for the first period of time.

13. The apparatus of claim 8, wherein the second current sensor generates a second signal when the current of the relay exceeds the second current set point for the second period of time.

14. The apparatus of claim 13, wherein the second signal is provided to the controller.

15. The apparatus of claim 14, wherein the controller causes the relay to open to decouple the load from the power source based on receipt of the second signal.

16. The apparatus of claim 13, wherein the second signal causes the relay to open to decouple the load from the power source.

17. The apparatus of claim 13, wherein the second signal includes an alarm signal indicating that the current of the relay exceeds the second current set point for the second period of time.

18. A method, comprising:
    determining a first current threshold for a first current sensor, the first current sensor having a first current measurement range and a first current measurement sensitivity;
    determining a second current threshold for a second current sensor, the second current sensor having a second current measurement range and a second current measurement sensitivity, wherein the first current threshold, the first current measurement range, and the first current measurement sensitivity are larger than the second current threshold, the second current measurement range, and the second current measurement sensitivity;
    determining a first time period corresponding to the first current threshold for the first current sensor;
    determining a second time period corresponding to the second current threshold for the second current sensor, wherein the second time period is larger than the first time period;
    continuously monitoring a current using the first current sensor and the second current sensor;
    generating a first signal when the current exceeds the first current threshold for an amount of time that exceeds the first time period;
    generating a second signal when the current exceeds the second current threshold for an amount of time that exceeds the second time period; and
    providing at least one of the first and second signals to a controller.

19. The method of claim 18, wherein generating a first signal further comprises generating a first alarm signal indicating the current exceeded the first current threshold for the amount of time that exceeds the first time period and generating a second signal further comprises generating a second alarm signal indicating the current exceeded the second current threshold for the amount of time that exceeds the second time period.

* * * * *